United States Patent
Furutani

Patent Number: 5,291,432
Date of Patent: Mar. 1, 1994

[54] SEMICONDUCTOR MEMORY DEVICE

[75] Inventor: Kiyohiro Furutani, Hyogo, Japan

[73] Assignee: Mitsubishi Denki Kabushiki Kaisha, Tokyo, Japan

[21] Appl. No.: 984,635

[22] Filed: Dec. 2, 1992

[30] Foreign Application Priority Data

Dec. 26, 1991 [JP] Japan .................. 3-344683
Jul. 30, 1992 [JP] Japan .................. 4-203717

[51] Int. Cl.$^5$ .............................................. G11C 5/02
[52] U.S. Cl. ........................................ 365/51; 365/63
[58] Field of Search ............ 365/51, 63, 204, 230.03, 365/207

[56] References Cited

U.S. PATENT DOCUMENTS 4,825,418 4/1989 Itoh ...................... 365/51
5,097,440 3/1992 Konishi ................... 365/51

OTHER PUBLICATIONS

"A 40ns 64Mb DRAM with Current-Sensing Data-Bus Amplifier", by Masao Taguchi et al., 1991 IEEE International Solid-State Circuits Conference, ISSCC91 Digest of Technical Papers, pp. 112-113.

"A 45ns 64Mb DRAM with a Merged Match-line Test Architecture", by Shigeru Mori et al., 1991 IEEE International Solid-State Circuits Conference, ISSCC91 Digest of Technical Papers, pp. 110-111.

Primary Examiner—Eugene R. LaRoche
Assistant Examiner—A. Zarabian
Attorney, Agent, or Firm—Lowe, Price, LeBlanc & Becker

[57] ABSTRACT

A semiconductor memory device is provided having a read out gate for detecting and providing to a main I/O line pair the potential difference of a sub-data input/output line pair, and a write gate for transferring data of the main I/O line pair to the sub-data input/output line pair in an empty region surrounded by a sense amplifier region and a word line coupling region. By providing the read out gate and the write gate in the empty region which was not conventionally used, the access operation can be carried out at high speed without increasing the chip area of the semiconductor memory device.

10 Claims, 15 Drawing Sheets

SEMICONDUCTOR MEMORY DEVICE

BACKGROUND OF THE INVENTION

1. Field of the Invention

The present invention relates to a semiconductor memory device including a plurality of memory cell regions, and more particularly, to improvement of a read/write gate of a semiconductor memory device and a high speed access operation.

2. Description of the Background Art

The semiconductor memory device industry is moving rapidly towards a larger storage capacity and a higher operation speed. This trend is particularly significant in the field of a DRAM (Dynamic Random Access Memory) where a memory cell is formed of one capacitor and one MOS transistor in a compact structure.

FIG. 8 shows a structure of such a semiconductor memory device. Referring to FIG. 8, a semiconductor memory device includes a sense amplifier region 1, a plurality of memory cell regions 2 arranged in a matrix of rows and columns, four row decoders 3, four column decoders 4, a word line coupling region 5 provided parallel to the memory cell regions in the row direction, an empty region 6, a read/write circuit 7, and a control circuit 66.

The plurality of memory cell regions 2 are symmetrized about the dot dash line in FIG. 8. The memory cell regions 2 at the left and right sides of the dot dash line are further symmetrized about the sense amplifier region 1.

The sense amplifier region 1 is located between a pair of memory cell regions 2 provided in the column direction. This sense amplifier region 1 is provided with a sense amplifier, an input/output gate and the like as will be described afterwards.

The control circuit 66 generates various signals for controlling the semiconductor memory device according to a row address strobe signal /RAS, a column address strobe signal /CAS, a write signal /WE, and an address signal Add. The generated signals include a block selecting signal $\phi$ indicated by a hollow arrow in the figure, an internal address signal (merely referred to as an "address signal" hereinafter) applied to the row decoder 3 and the column decoder 4, and an internal read/write signal for controlling the read/write circuit 7.

The row decoder 3 selects a word line WL in response to an address signal to pull the selected word line WL to a H level (logical high). The sense amplifier provided in the sense amplifier region 1 amplifies the data of a memory cell connected to the selected word line WL. The column decoder 4 selects a desired bit from the memory cells of one row of the selected word line WL in response to an address signal.

The word line coupling region 5 serves to reduce the impedance of a word line WL.

FIG. 9 shows a structure of the word line WL indicated by the broken line in FIG. 8. Because the word line WL has a high resistance due to the fact that it is generally formed of a polysilicon layer, the time constant takes a high value when the word line rises. The resistance of a word line is reduced by short-circuiting the aluminum interconnection and the polysilicon interconnection in the word line coupling region 5 provided parallel to the memory cell regions 2 in the column direction. As a result, the time constant at the time of the rise of the word line is reduced to allow a higher speed of operation of the semiconductor memory device.

As an alternative of connecting the aluminum interconnection and the polysilicon interconnection, a buffer circuit formed of two stages of inverters may be provided in the word line coupling region 5, as shown in FIG. 10. This gives the advantage of preventing delay in the word line selecting signal. The word line coupling method and the method of providing a buffer circuit both have the impedance of the word line reduced.

FIG. 11 schematically shows a layout of the portion surrounded by the chain line with one dot in FIG. 8. Referring to FIG. 11, the portion surrounded by a chain line with one dot B includes a word line 40, bit lines BL and /BL, and a contact hole 41. Contact holes 41 are arranged in upper and lower stages so as not to form a contact with each other. The polysilicon layer and the aluminum interconnection are overlayed as shown in FIG. 9 to be connected by the contact hole 41 in the word line coupling region 5.

The empty region 6 is a region surrounded by the word line coupling regions 5 and the sense amplifier regions 1, establishing a margin in the layout. Although two MOS transistors 42 and 43 are provided in this region 6 as will be described afterwards with reference to FIG. 12, it is considered substantially as an empty region.

FIG. 12 is a circuit diagram showing the portion surrounded by a chain line with two dots A in FIG. 8 showing a structure of a conventional semiconductor memory device. Referring to FIG. 12, the sense amplifier region 1 to the left of the dot dash line includes NMOSFETs 7, 8, 11 and 12 serving as memory cell region selecting gates, NMOSFETs 9 and 10 serving as input/output gates, a circuit 39 including a sense amplifier and a bit line equalize circuit, and a sub-I/O line pair of SIO1 and /SIO1. The sense amplifier region 1 located at the right hand side of the dot dash line is similar to the sense amplifier region 1 located at the left hand side of the dot dash line, and includes NMOSFETs 25, 26, 29, and 30 serving as memory cell region selecting gates, NMOS transistors 27 and 28 serving as input/output gates, a circuit 39 including a sense amplifier and an equalize circuit, and a sub-I/O line pair of SIO3 and /SIO3.

The empty region 6 located at the left hand side of the dot dash line includes NMOSFETs 42 and 43 serving as block selecting gates. The empty region 6 located at the right hand side of the dot dash line includes NMOSFETs 44 and 45 serving as block selecting gates. The signal $\phi 1$ in FIG. 12 is a signal for selecting the block to the left of the dot dash line when attaining a high level. The signal $\phi 2$ is a signal for selecting the block to the right of the dot dash line. The signal $\phi S1$ selects the memory cell regions located at the left-hand side of the sense amplifier region 1 in the region to the left of the dot dash line. The signal $\phi S2$ selects the memory cell regions located at the right-hand side of the sense amplifier region 1 in the region to the left of the dot dash line. Similarly, signals $\phi S3$ and $\phi S4$ are signals for selecting the memory cell regions at the left-hand side and the right-hand side, respectively, of the sense amplifier region 1 in the region to the right of the dot dash line.

Signal BLEQ serves to equalize the potential of the bit line pair.

The circuit 39 equalizes the potential of the bit lines BL and /BL and detects the potential difference of bit lines BL and /BL. The details of this circuit 39 are shown in FIG. 13. Referring to FIG. 13, the circuit 39 includes a sense amplifier 39S responsive to sense amplifier driving signals φP and φN for detect-amplifying the potential difference of bit lines BL and /BL, and an equalize circuit 39E responsive to a bit line equalize signal BLEQ for equalizing the potential of bit lines BL and /BL to a half of the power supply potential Vcc. Sense amplifier driving signals φP and φN are complementary to each other.

FIG. 14 is a timing chart of the semiconductor memory device of FIG. 12.

The reading and writing operation of the data of memory cell 21 in FIG. 12 will be described with reference to the timing chart of FIG. 14.

At time t1, a row address signal is latched when the row address strobe signal /RAS attains a L level (logical low). At time t2, the signal φS1 for selecting a memory cell region attains a L level and the word line WL1 connected to the access gate of the memory cell 21 attains a H level according to the row address signal. The signal φS2 for selecting the memory cell regions of the righthand side maintains a H level. In response to signal φS2, the memory cell region selecting gates 7 and 8 are turned off and the memory cell region selecting gates 11 and 12 are turned on. Thus, the data of the memory cell 21 is read out to the bit line BL2, whereby a potential difference is generated between the bit line pair BL2 and /BL2.

At time t3, when the sense amplifier 39S is activated, the potential difference of the bit line pair BL2 and /BL2 is amplified. At time t4, the column decoder 4 pulls the column selecting signal Yi to a H level according to a column address signal. The block selecting signal φ1 attains a H level and the block selecting gates 42 and 43 are turned on. As a result, the bit line pair BL2 and /BL2, the sub-I/O line pair SIO2 and /SIO2, and the main I/O line pair GIO2 and /GIO2 are connected, whereby the potentials of the bit line pair BL2 and /BL2 are transmitted to the main I/O line pair GIO2 and /GIO2. The read/write circuit 7 shown in FIG. 8 detects the potential difference of the main I/O line pair GIO2 and /GIO2 to identify the data maintained in the memory cell 21. The data held in the memory cell 21 is logical high when the potential of the main I/O line GIO2 is higher than that of /GIO2, and is logical low when the potential of the main I/O line GIO2 is lower than that of /GIO2.

At time t5 when the write signal /WE attains a L level, the write data applied to the main I/O lines GIO2 and /GIO2 is supplied to bit lines BL2 and /BL2 via the sub-I/O lines SIO2 and /SIO2, whereby data is written into the memory cell 21.

Because the structure of FIG. 12 has the sub-I/O line pair and the main I/O line pair connected to the bit line pair when the column selecting signal Yi attains a H level, the column selecting signal Yi must be pulled up to the H level after the potential difference is amplified by the sense amplifier 39S.

This is because the sub-I/O lines and main I/O lines having a great parasitic capacitance will be connected to the bit line when the column selecting signal Yi is brought to a H level prior to a sense amplifying operation to result in a small potential difference between the bit lines BL2 and /BL2, leading to a possibility of erroneous operation caused by the sense amplifier failing to amplify the small potential difference.

There is a conventional circuit shown in FIG. 15 for solving such a problem. FIG. 15 is a circuit diagram showing an example of structure of a conventional semiconductor memory device. The semiconductor memory device of FIG. 15 differs from the semiconductor memory device of FIG. 12 in that NMOSFETs 46-49 serving as read out gates in the sense amplifier region located at the left side of the dot dash line, and NMOSFETs 52 and 53 for selecting a read out block in the empty region 6 located below the sense amplifier region 1 are added. Similarly, NMOSFETs 56-59 serving as read out gates in the sense amplifier region 1 located at the right-hand side of the dot dash line and NMOSFETs 62 and 63 for selecting a read out block in the empty region 6 provided beneath the sense amplifier region 1 are added. A sub-output line pair of SO1 and /SO1 exclusively for reading and a sub-input line pair of SI1 and /SI1 exclusively for writing are provided.

FIG. 16 is a timing chart for showing the operation of the semiconductor memory device of FIG. 15.

The operation of reading out data from the memory cell 21 of FIG. 15 and writing an inverted data will be described with reference to the timing chart of FIG. 16.

At time t1 where the row address strobe signal /RAS attains a L level, a row address signal is latched. The row decoder 3 pulls the word line WL1 to a H level according to the row address signal. In response, the address gate of the memory cell 21 is turned on, whereby the data in memory cell 21 is read out to the bit line pair BL and /BL. At time t3, the column selecting signal YRi is brought to a H level to conduct NMOSFETs 48 and 49, and the block selecting signal φ1 is brought to a H level to conduct NMOSFETs 52 and 53. Because the potential of bit line BL2 is higher than that of the bit line /BL2, NMOSFET 46 is turned on more heavily than NMOSFET 47. Therefore, the potentials of the sub-output line SO1 and the main I/O line GIO2 become lower than the respective potentials of the sub output line /SO1 and the main I/O line GIO2. The read/write circuit 7 detects the potential difference between main I/O lines GIO and /GIO to identify the data held in the memory cell 21. When the potential of the main I/O line GIO is lower than that of /GIO, the memory cell data is logical high. When the potential of the main I/O line GIO is higher than that of /GIO, the memory cell data is logical low.

As described above, the semiconductor memory device of FIG. 15 differs from the semiconductor memory device of FIG. 12 in that the column selecting signal YRi is brought to a H level before the sense amplifying operation and reads out the memory cell data to main I/O line pair GIO2 and /GIO2. This offers an advantage of a faster read out operation of the memory cell data to the main I/O line pair of GIO2 and /GIO2.

At time t4 when the write signal /WE is brought to a L level, the column selecting signal YWi attains a H level, whereby the data in the main I/O line is applied to the bit line. Then, the potential of the bit line BL2 is written to the memory cell 21.

The conventional semiconductor memory device of the above-described structure has the width W2 of the sense amplifier region 1 in the column direction of FIG. 15 increased in comparison with the width W1 of the sense amplifier region in the column direction of FIG. 12 for increasing the read out speed of data when the structure of FIG. 12 is implemented as shown in FIG. 15. This results in a problem of increase in the chip area.

SUMMARY OF THE INVENTION

An object of the present invention is to allow high speed access operation in a semiconductor memory device including a plurality of memory cell regions without increase in the chip area.

Another object of the present invention is to allow a high speed access operation in a semiconductor memory device including a plurality of memory cell regions by increasing the potential difference in bit lines at the time of data read out.

A further object of the present invention is to allow a high speed access operation in a semiconductor memory device including a plurality of memory cell regions by limiting the potential difference of bit lines at a constant value at the time of page mode operation.

A semiconductor memory device according to the present invention includes a plurality of memory cell regions, a main data input/output line pair, a sub-data input/output line pair, a plurality of data input/output controllers, a plurality of impedance reducing portions, a plurality of read circuits, and a plurality of write circuits. The plurality of memory cell regions are arranged in row and column directions. The main data input/output line pair transmits externally generated data and internally generated data. The sub data input/output line pair is provided in a region between memory cell regions in the column direction for transmitting data with respect to an adjacent memory cell region. The plurality of data input/output controllers are provided in a region between memory cell regions in the column direction for carrying out data input/output control between each bit line pair of an adjacent memory cell region in the column direction and the sub-data input/output line pair. The plurality of impedance reducing portions are provided between memory cell regions in the row direction for reducing impedance of a word line. The plurality of read circuits are provided in a region surrounded by the region in which the data input/output controllers are provided and by the region in which the impedance reducing portions are provided for detecting the potential difference of the sub-data input/output line pair to provide the same to the main data input/output line pair. The plurality of write circuits are provided in the same region where the read circuits are provided for transferring the data of the main data input/output line pair to the sub-data input/output line pair.

In operation, the read circuit detects the potential difference of the sub-data input/output line pair to provide the same to the main data input/output line pair, whereby the data read out speed is improved. The read circuits are provided in the region where the data input/output controllers are provided and in the region where the impedance reducing portions are provided, i.e. the region which was not conventionally used effectively. Therefore, the semiconductor memory device according to the present invention can carry out a high speed access operation without increase in the chip area.

A semiconductor memory device according to another aspect of the present invention includes a plurality of memory cell regions, a main data input/output line pairs, a plurality of sub-data input/output line pairs, a plurality of sense amplifiers, a plurality of input/output gates, a plurality of impedance reducing portions, a plurality of read circuits, and a plurality of write circuits. The plurality of memory cell regions are arranged in the directions of rows and columns, each including a plurality of word lines provided in the row direction, a plurality of bit lines provided in the column direction, and a plurality of memory cells provided at the crossings of each word line and each bit line. The main data input/output line pair transmits externally generated data and internally generated data. The plurality of sub-data input/output line pairs are provided between each pair of the memory cell regions in the column direction, wherein each transmits data with respect to an adjacent memory cell region. The plurality of sense amplifiers are provided between each pair of memory cell regions in the column direction, wherein each detects the potential difference in each bit line pair of an adjacent memory cell region. The plurality of input/output gates are provided between each pair of memory cell regions in the column direction, wherein each is connected between each bit line pair of an adjacent memory cell region and the sub-data input/output line pair. The plurality of impedance reducing portions are provided between memory cell regions in the row direction for reducing impedance of a word line. The plurality of read circuits for detecting the potential difference in the sub-data input/output line pair to provide the same to the main data input/output line pair are provided in a region surrounded by a region in which input/output gates and sense amplifiers are provided and by the region in which the impedance reducing portions are provided. The plurality of write circuits are provided in the same region where the read circuits are provided for transferring data on the main data input/output line pair to the sub-data input/output line pair.

In operation, the plurality of read circuits are provided in each region surrounded by the region in which sense amplifiers and input/output gates are provided and by the region in which impedance reducing portions are provided, whereby a high speed access operation of a semiconductor memory device can be carried out without increase in chip area.

According to a further aspect of the present invention, a semiconductor memory device has a read circuit activated right after the activation of the amplifier.

In operation, the read circuit is activated before the activation of the sense amplifier for the speed enhancement, because the read circuit does not disturb the operation of the sense amplifier. The sense amplifier amplifies the potential difference of the bit line, and the potential difference is transferred to the sub-data input/output line pair via the input/output gate. If the potential difference in the sub-data input/output line pair is too great, the time required for pulling down the sub-data input/output line pair will be increased. Therefore, there is a possibility of a disadvantage in high speed in page mode operation.

According to still another aspect of the present invention, a semiconductor memory device further includes a circuit for limiting the potential difference of the sub-data input/output line pair to a constant potential. In operation, because the potential difference of the sub-data input/output line pair is limited to a constant potential, a high speed access operation of a semiconductor memory device can be carried out even in page mode operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
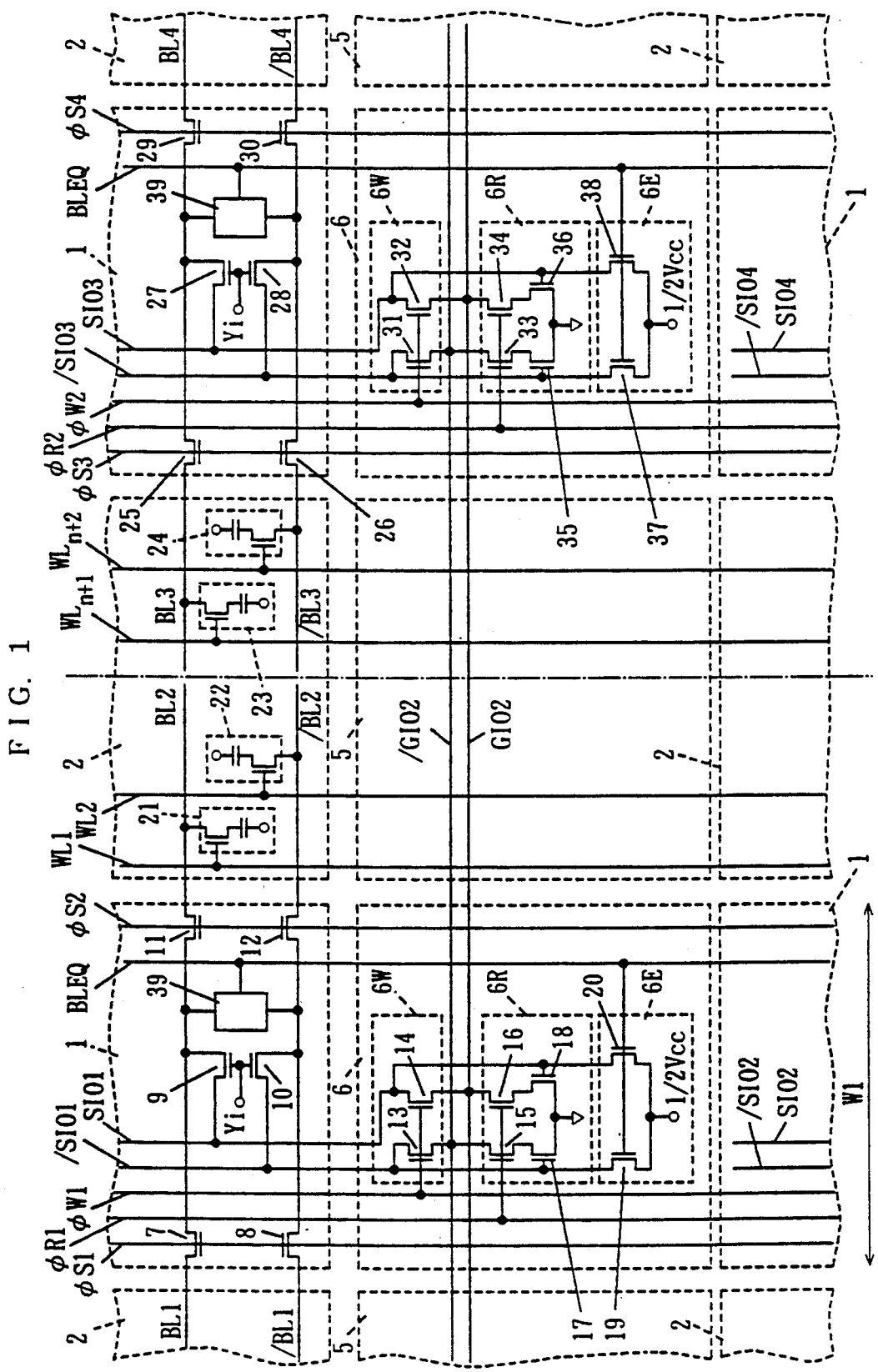
FIG. 1 is a structure of a semiconductor memory device according to an embodiment of the present invention.

FIG. 1 is a circuit diagram showing an embodiment of the present invention. The semiconductor memory device of FIG. 1 differs from the semiconductor memory device of FIG. 12 in that a read gate 6r, a write gate 6w, and an equalized circuit 6E for equalizing the potentials of a sub-I/O line pair are provided in each empty region 6, and that the block selecting signal is divided into a block selecting signal for writing /W and a block selecting signal for reading $\phi$R.

Because the semiconductor memory device of FIG. 1 is symmetrized about the dot dash line, the portion to the left of the dot dash line will be described in the following description.

The write gate 6W includes NMOSFETs 13 and 14. Each NMOSFET includes one electrode (drain electrode or source electrode), the other electrode (source electrode or drain electrode), and a gate electrode. The NMOSFET 13 has one electrode connected to the sub-I/O line SIO1, the other electrode connected to the main I/O line /GIO2, and the gate electrode connected to receive a block selecting signal $\phi$W1 together with the NMOSFET 14. The NMOSFET 14 has one electrode connected to the sub-I/O line SIO1, and the other electrode connected to the main I/O line GIO2.

The read gate 6R includes NMOSFETs 15–20. The NMOSFET 15 has one electrode connected to the main I/O line /GIO2, the other electrode connected to one electrode of the NMOSFET 17, and the gate electrode connected to receive the block selecting signal $\phi$R1 together with the gate electrode of the NMOSFET 16. The NMOSFET 16 has one electrode connected to the main I/O line GIO2, and the other electrode connected to the one electrode of the NMOSFET 18. The NMOSFET 17 has the other electrode connected to receive the ground potential Vss, and the gate electrode connected to the sub-I/O line /SIO1. The NMOSFET 18 has the other electrode connected to receive the ground potential Vss, and the gate electrode connected to the sub-I/O line SIO1.

The equalize circuit 6E includes NMOSFETs 19 and 20. The NMOSFET 19 has one electrode connected to the sub-I/O line /SIO1, the other electrode connected to receive a potential of ½ Vcc which is a half of the power supply voltage, and the gate electrode connected to receive the bit line equalize signal BLEQ together with the gate electrode of the NMOSFET 20. The NMOSFET 20 has the other electrode connected to the sub-I/O line SIO1.

Figure 2:
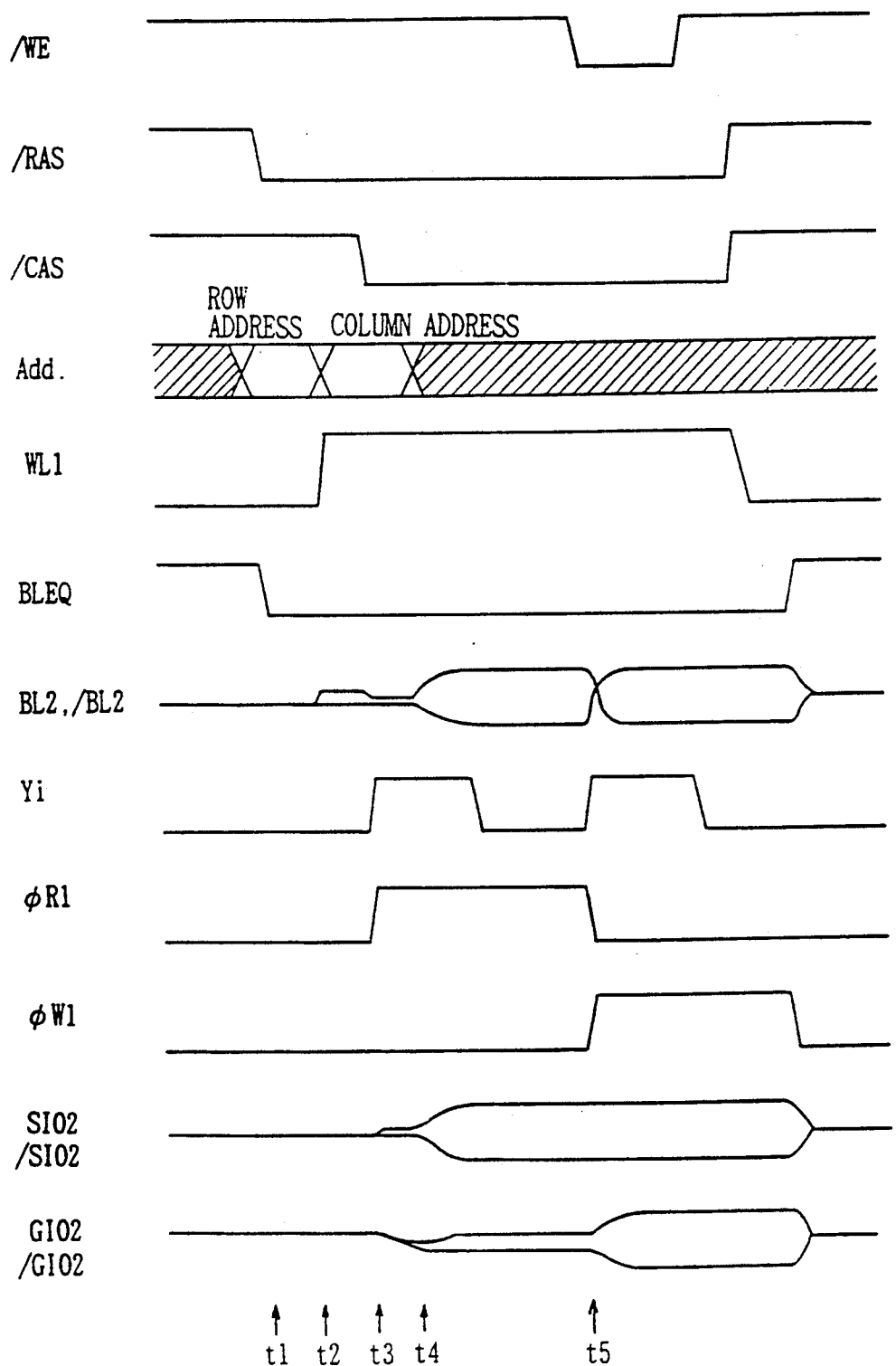
FIG. 2 is a timing chart showing an operation of the semiconductor memory device of FIG. 1.

FIG. 2 is a timing chart of the semiconductor memory device of FIG. 1.

The operation of reading out the memory cell 21 having a data of a H level stored therein and rewriting thereof will be described hereinafter with reference to the timing chart of FIG. 2.

Figure 13:
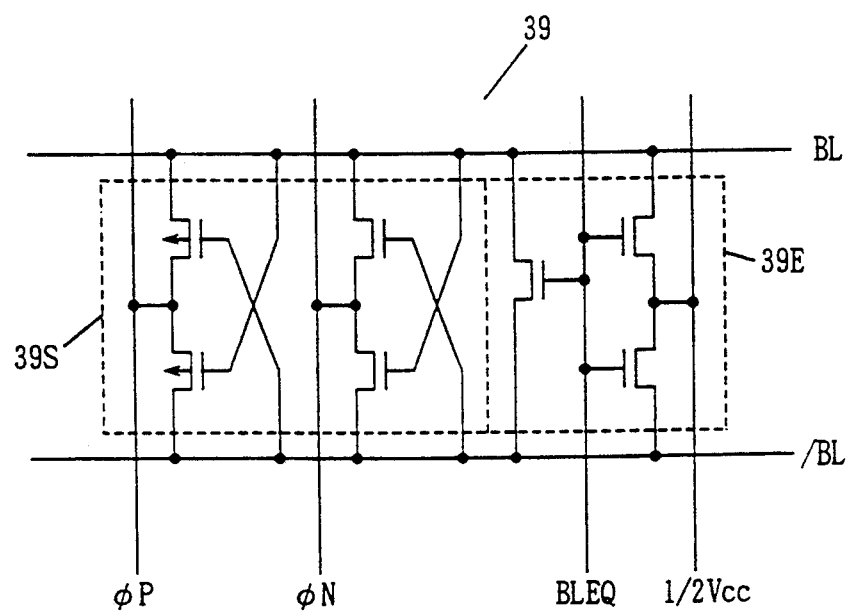
FIG. 13 is a circuit diagram showing in details the circuit 39 of FIG. 12.
Figure 14:
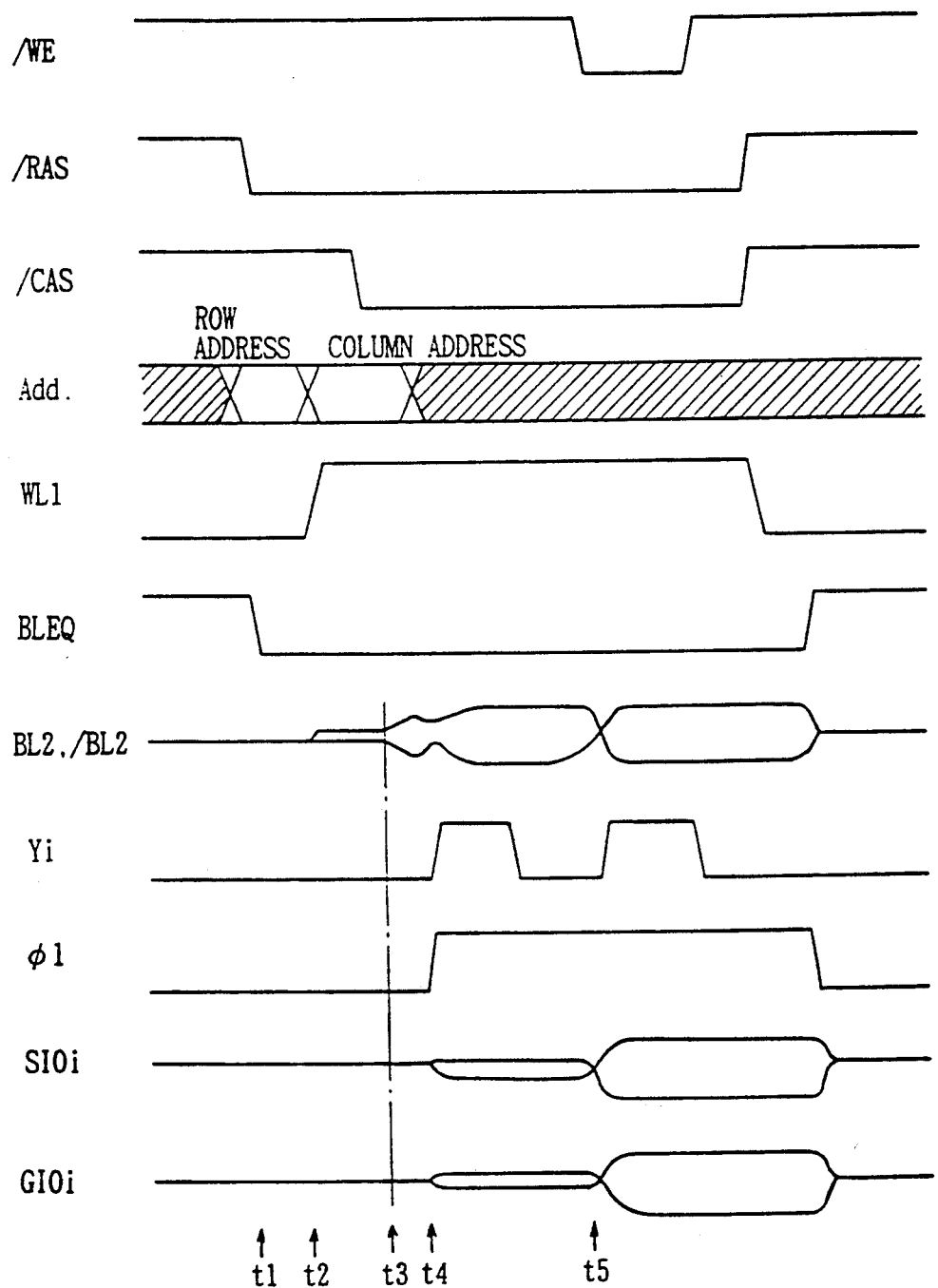
FIG. 14 is a timing chart showing an operation of the semiconductor memory device of FIG. 12.

The bit line equalize signal BLEQ is pulled up to a H level when the row address strobe signal /RAS attains a H level. In response, the bit line equalize circuit 39E (FIG. 13) precharges bit lines BL and /BL to ½ Vcc. Also, the NMOSFETs 19 and 20 of the equalize circuit 6E are turned on to precharge the sub-I/O lines SIO and /SIO to ½ Vcc.

At time t1 when the row address strobe signal /RAS is pulled to a L level, a row address signal is latched. At time t2, a signal $\phi$S1 selecting a memory cell region left-side of the sense amplifier region is brought to a L level, and a word line WL1 corresponding to the latched row address signal rises. The signal $\phi$S2 that selects the memory cell region of the right side of the sense amplifier region maintains a H level. As a result, the data in the memory cell 21 is read out to the bit line pair of BL2 and /BL2. At time t3, the block selecting signal $\phi$R1 is brought to a H level, and the column selecting signal Yi attains a H level according to a row address signal. In response, NMOSFETs 15 and 16, the input/output gates 9 and 10 turn on. As a result, the bit line pair of BL2 and /BL2 is connected to the sub-I/O line pair of SIO1 and /SIO1. However, the sub-bit line pair of BL2 and /BL2 is not connected to the main I/O line pair of GIO2 and /GIO2 because the NMOSFETs 13 and 14 are not conductive.

Figure 8:
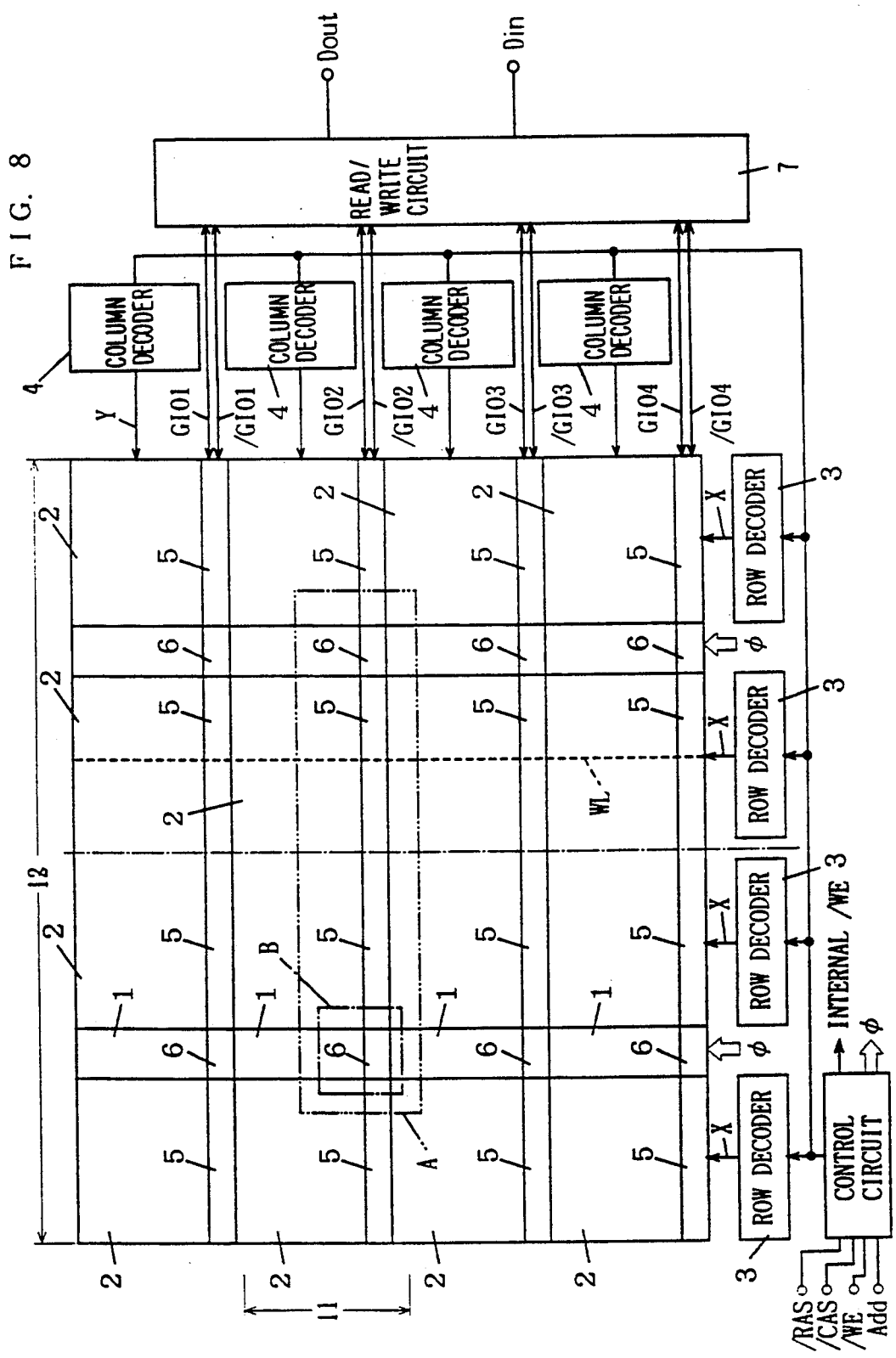
FIG. 8 shows an entire structure of a semiconductor memory device of the background art.
Figure 9:
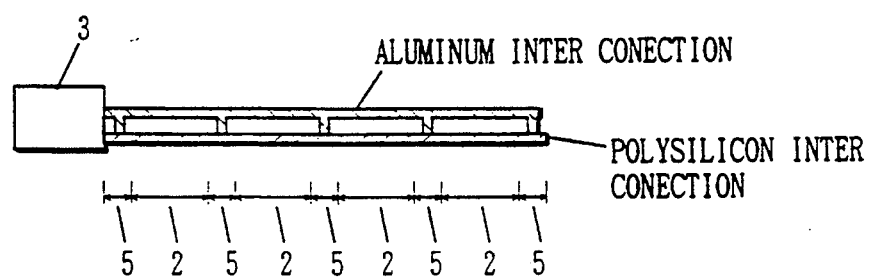
FIG. 9 is a diagram for describing a structure of the word line shown in FIG. 8.
Figure 10:
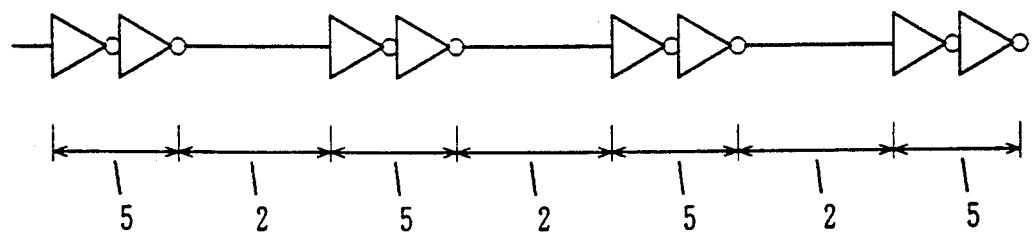
FIG. 10 is a diagram showing another structure of the word line of FIG. 8.
Figure 11:
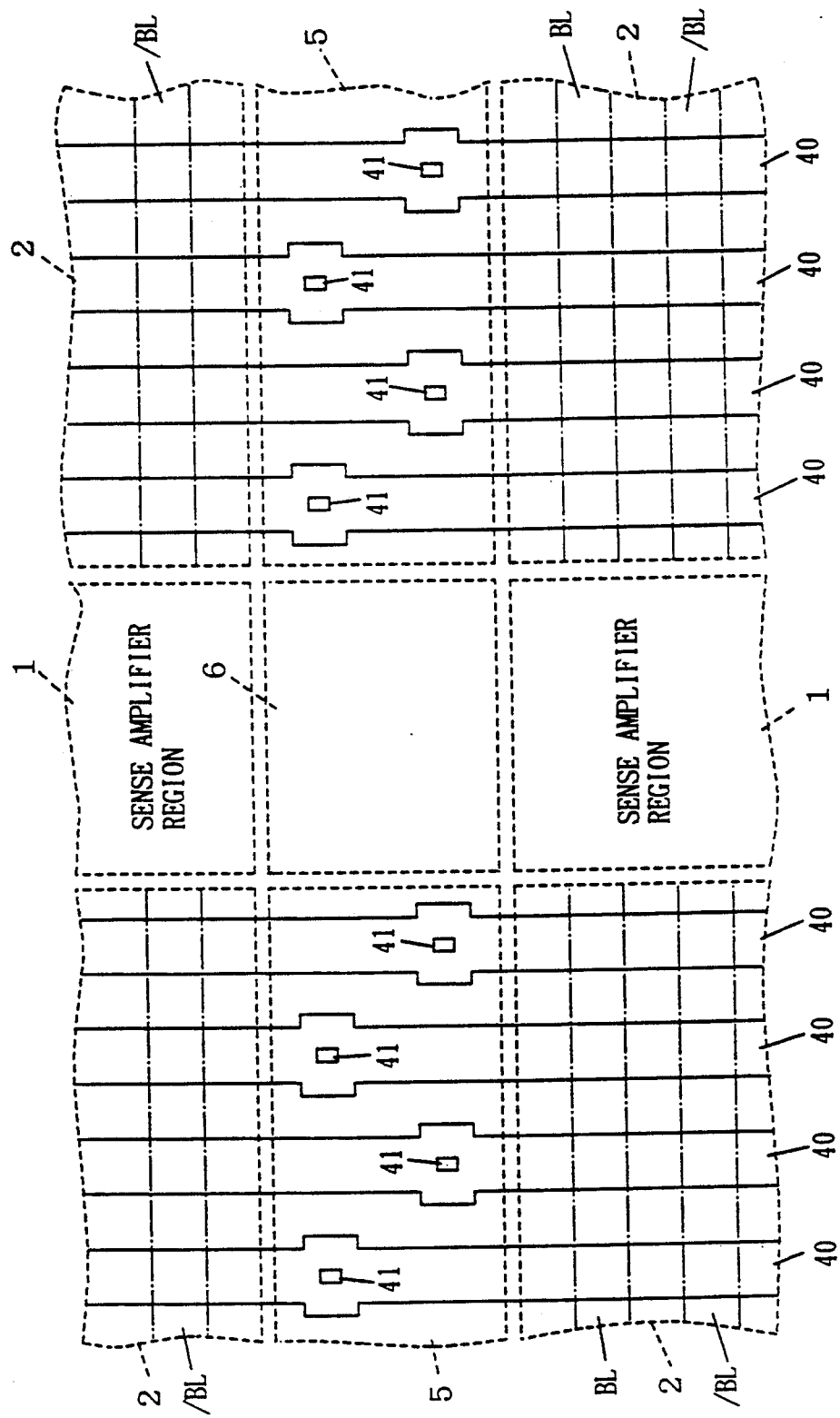
FIG. 11 shows in details the portion surrounded by the chain line with one dot B of FIG. 8.
Figure 12:
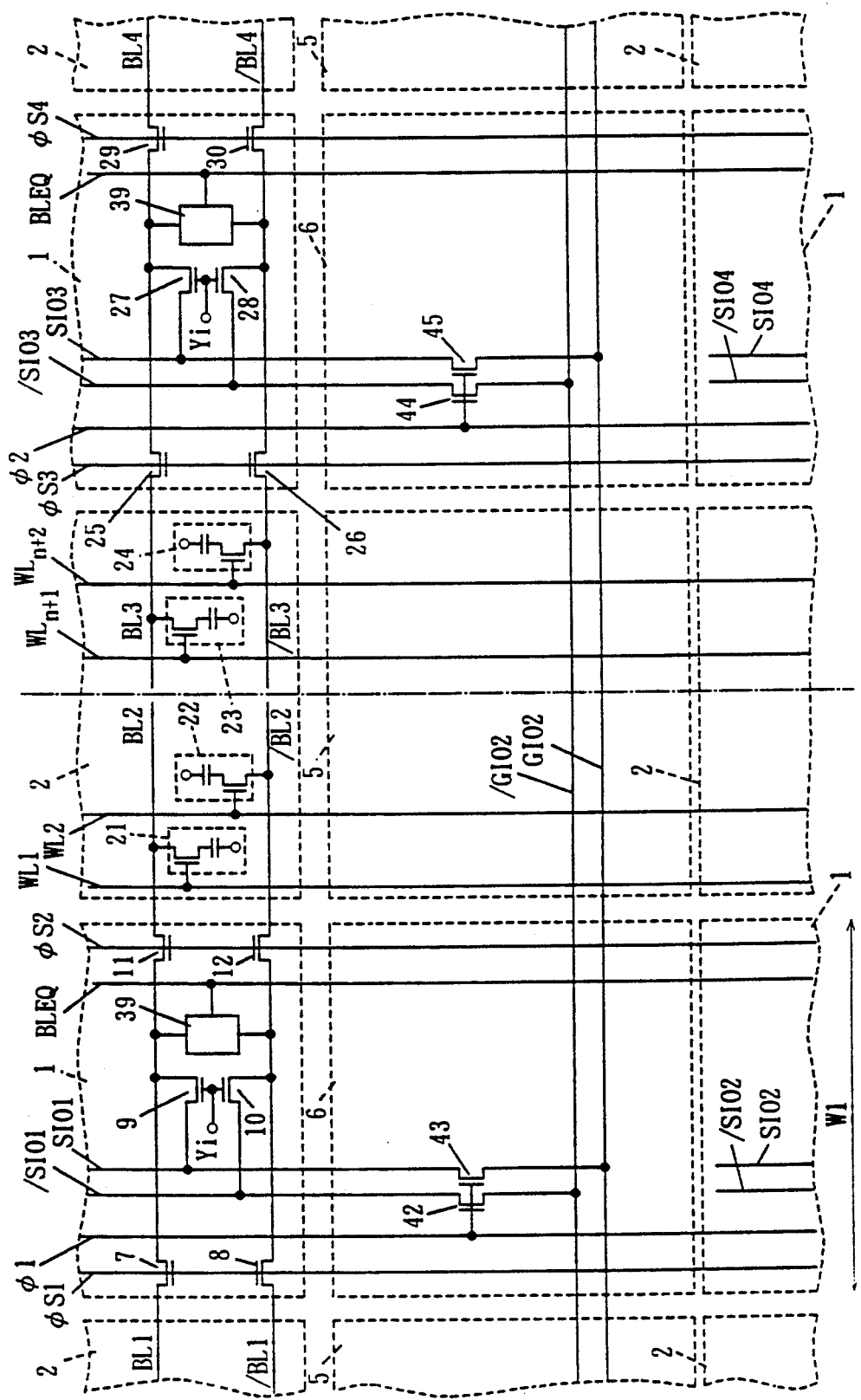
FIG. 12 is a structure of a conventional semiconductor memory device.

Because the bit line pair of BL2 and /BL2 is not connected to the main I/O line pair of GIO2 and /GIO2, reduction in the potential difference appearing on the bit line pair of BL2 and /BL2 is significantly smaller than that of FIG. 12. This advantage can be explained as follows. As shown in FIG. 8, the length L1 of the sub-I/O lines SIO and /SIO is considerably shorter than the length L2 of the main I/O line pair of GIO and /GIO. Therefore, the parasitic capacitance of the sub-I/O is much smaller than that of GIO. This means that the decrease in potential difference of the bit line pair as a result of the bit line pair of BL2 and /BL2 being connected to the sub-I/O lines SIO1 and /SIO1 on account of the column selecting signal Yi attaining a H level is considerably smaller than the case where the bit line pair is connected to both the sub-I/O lines and the main I/O line as a result of the column selecting signal pulled up prior to a sense-amplification in the structure of FIG. 12.

Therefore, according to the structure of FIG. 1, the sense amplifier will not fail to amplify the potential difference of the bit lines even if the column selecting signal Yi is pulled up to a H level prior to the sense-amplification.

At time t3, the potential of the sub-I/O line SIO1 becomes higher than the potential of /SIO1 because the sub-I/O lines SIO, connected to bit line BL2, which hold higher potential than /BL2. At time t4, the potential difference of the sub-I/O line pair can be increased by the difference in this conductivity. Because the block selecting signal $\phi$R1 attains a H level at this time, NMOSFETs 15 and 16 are conductive. Therefore, the potential of the main I/O line GIO2 becomes lower than the potential of /GIO2. The read/write circuit 7 detects the potential difference between the main I/O lines of GIO2 and /GIO2 to identify the data held in the memory cell 21. If the potential of the main I/O line GIO2 is lower than that of /GIO2, the data in memory cell 21 is identified as attaining a H level. If the potential of the main I/O line GIO2 is higher than that of /GIO2, the data in the memory cell 21 is identified as a L level.

At time t5 when the write signal /WE is pulled down to a L level, the column selecting signal Yi and the block selecting signal $\phi$W1 attain a H level, whereby the data in the main I/O line pair of GIO2 and /GIO2 are transmitted to bit lines BL2 and /BL2 via the sub-I/O line pair of SIO2 and /SIO2. Thus, the potential of the bit line BL2 is written into the memory cell 21.

Figure 15:
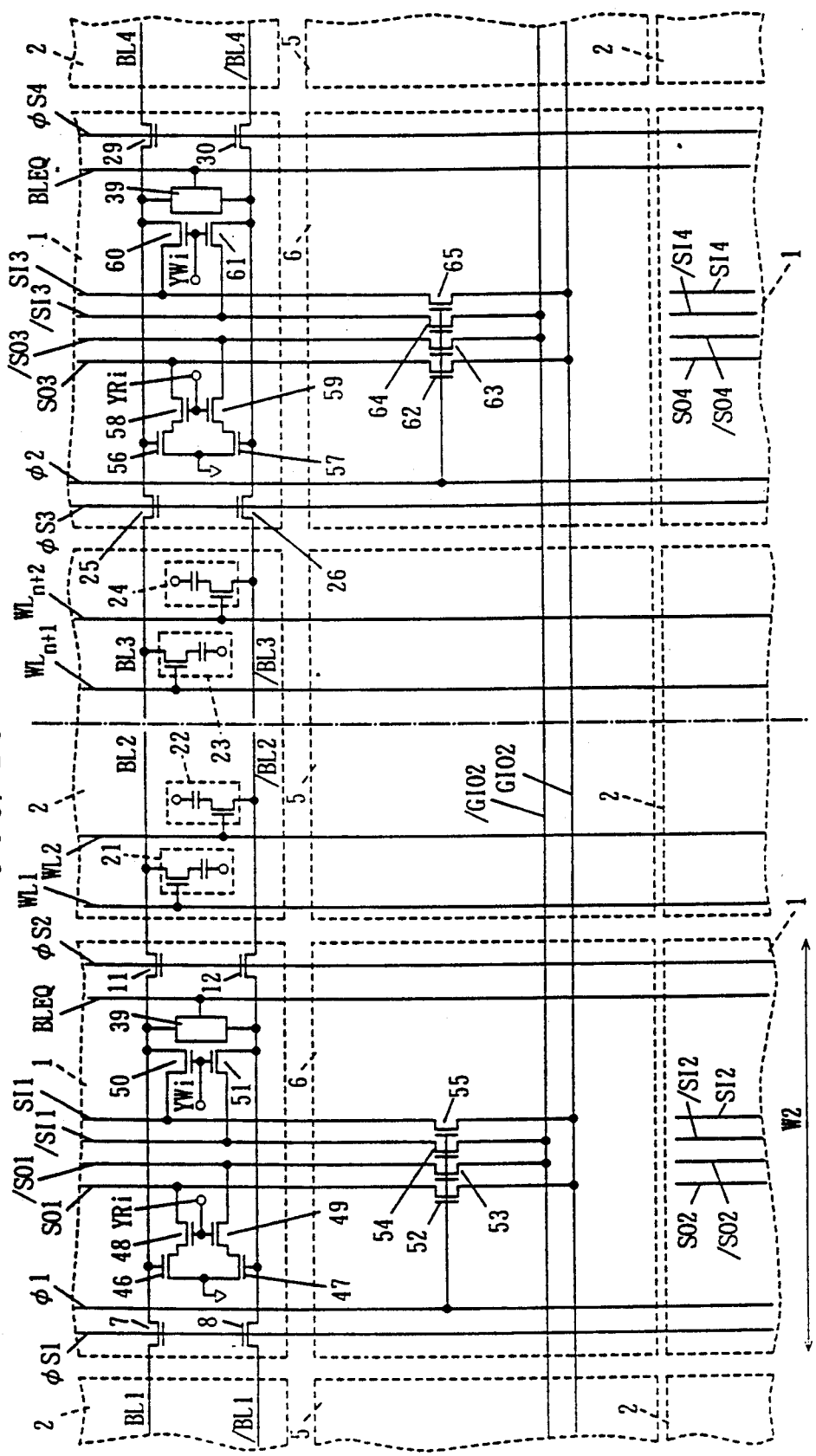
FIG. 15 is a structure showing another example of a conventional semiconductor memory device.
Figure 16:
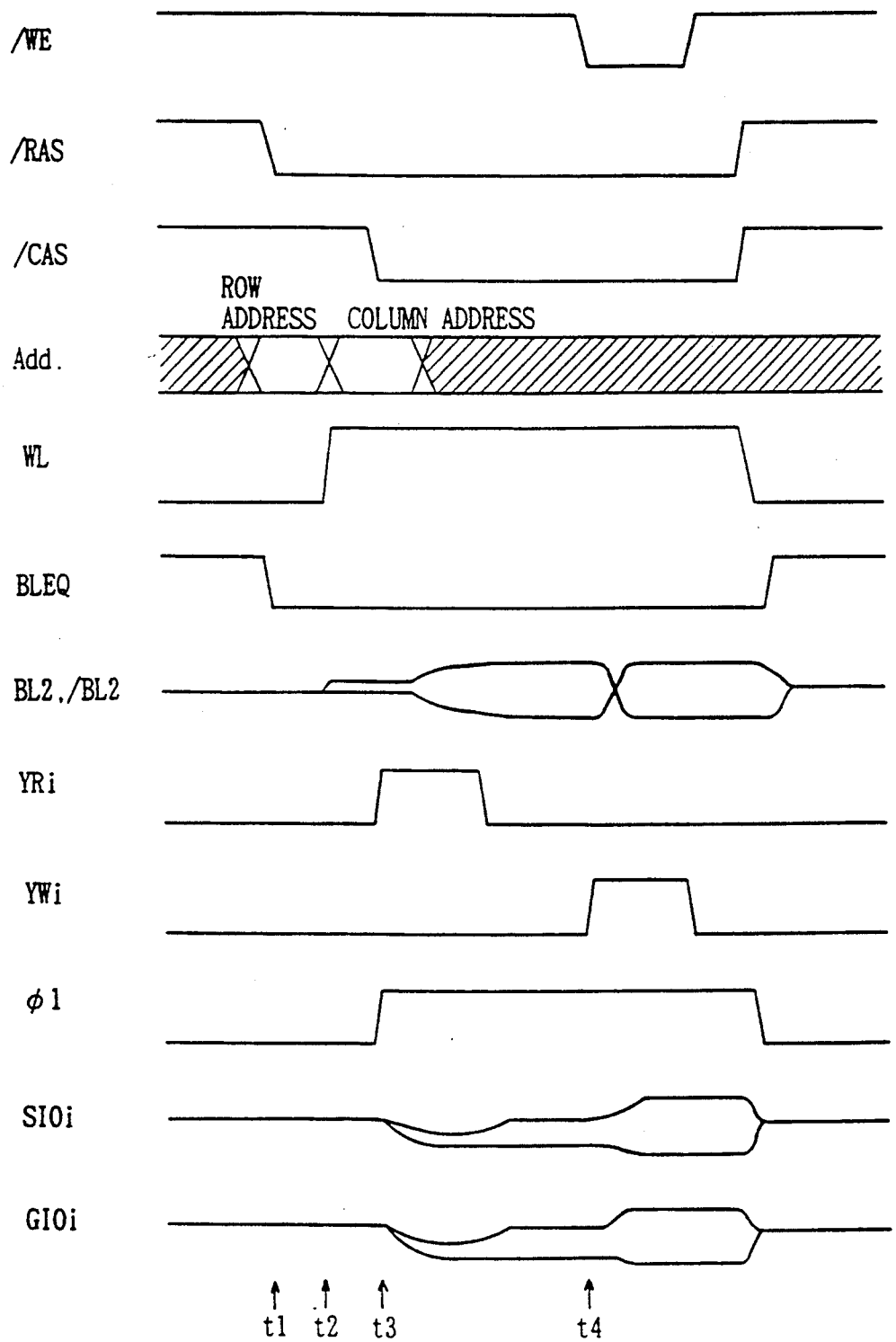
FIG. 16 is a timing chart showing an operation of the semiconductor memory device of FIG. 15.

The structure of the semiconductor memory device of FIG. 1 has a width W1 of the sense amplifier region identical to that in the structure of the semiconductor memory device of FIG. 12. However, according to the structure of the semiconductor memory device of FIG. 1, the column selecting signal is activated prior to the amplification of the potential difference of the bit line pair by the sense amplifier to read out data to the main I/O line, so that data read out from a memory cell can be carried out at a high speed, as in the case of the structure of FIG. 15.

Figure 3:
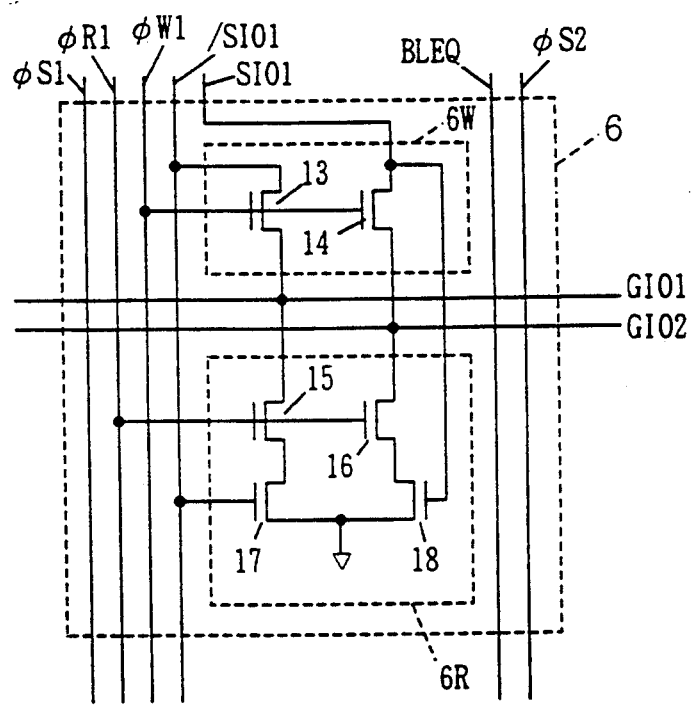
FIG. 3 is a structure of a semiconductor memory device according to a second embodiment of the present invention.

Since the structure of FIG. 1 has the NMOSFETs for precharging the potential of the sub-I/O line to $\frac{1}{2}$ Vcc both in the sense amplifier region 1 and the region 6 surrounded by the word line coupling regions 5, the equalize circuit 6E in region 6 can be omitted as shown in FIG. 3 with only a read gate 6R and a write gate 6W provided.

FIG. 3 is a circuit diagram showing a second embodiment of the present invention. The operation of precharging the sub-I/O lines SIO1 and /SIO1 to $\frac{1}{2}$ Vcc in the circuit of FIG. 3 will be described with reference to the timing chart of FIG. 4.

Figure 4:
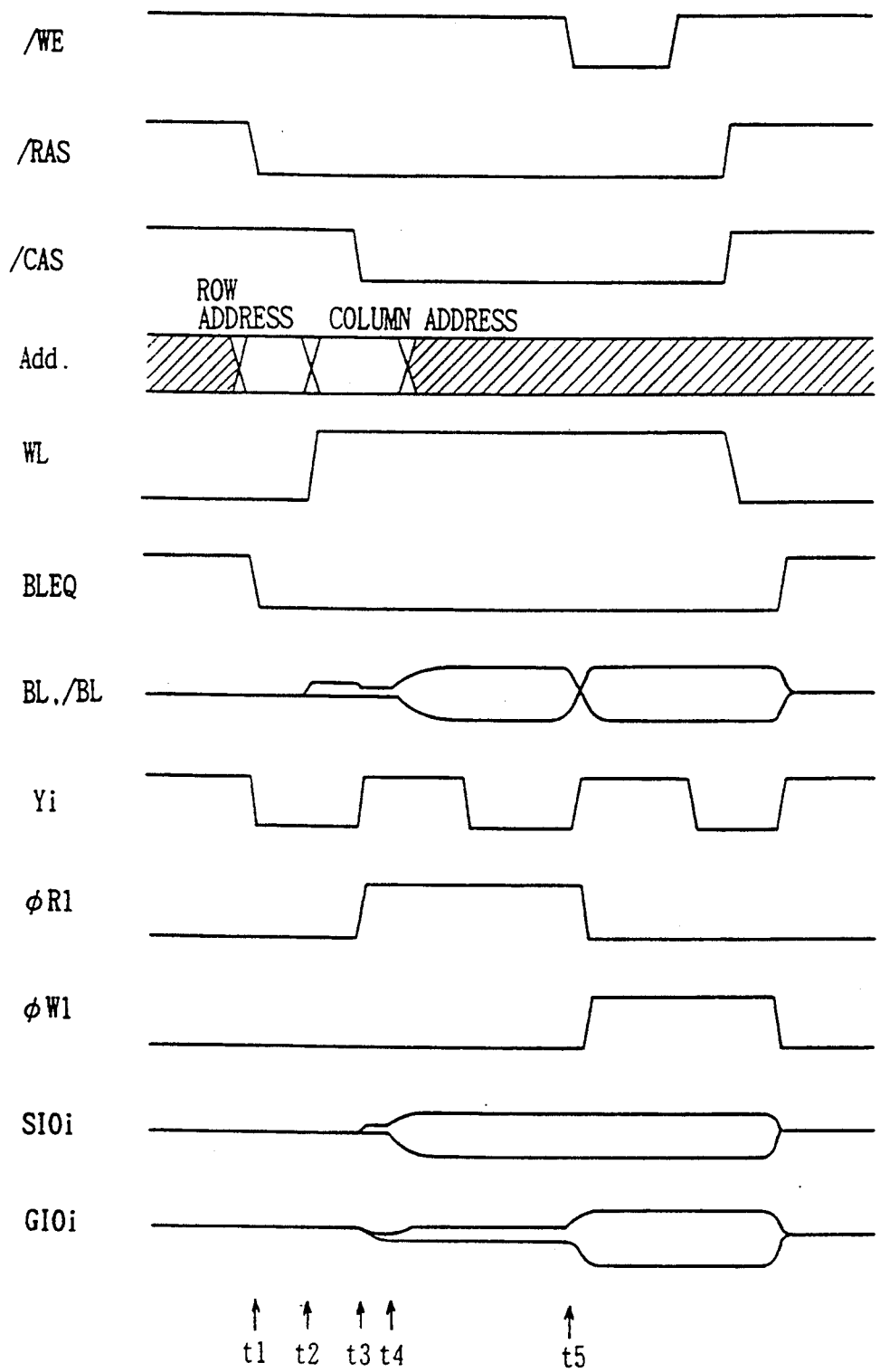
FIG. 4 is a timing chart showing an operation of the semiconductor memory device of FIG. 3.

The timing chart of FIG. 4 differs from the timing chart of FIG. 2 in that at least one of the column selecting signal Yi among the column selecting signals Yi provided to the region sense amplifier is pulled up to a H level when the row address strobe signal /RAS attains a H level. The other waveforms are similar to those of FIG. 2.

In the beginning, at least one of the column selecting signal Yi is pulled up to a H level when the row address strobe signal /RAS attains a H level. In response to this column selecting signal, the corresponding input/output gate is turned on, whereby the bit lines BL and /BL are connected to the corresponding sub-I/O lines SIO and /SIO. Therefore, the sub-I/O line pair is precharged to $\frac{1}{2}$ Vcc. The operation succeeding time t1 is similar to that of FIG. 1.

Figure 5:
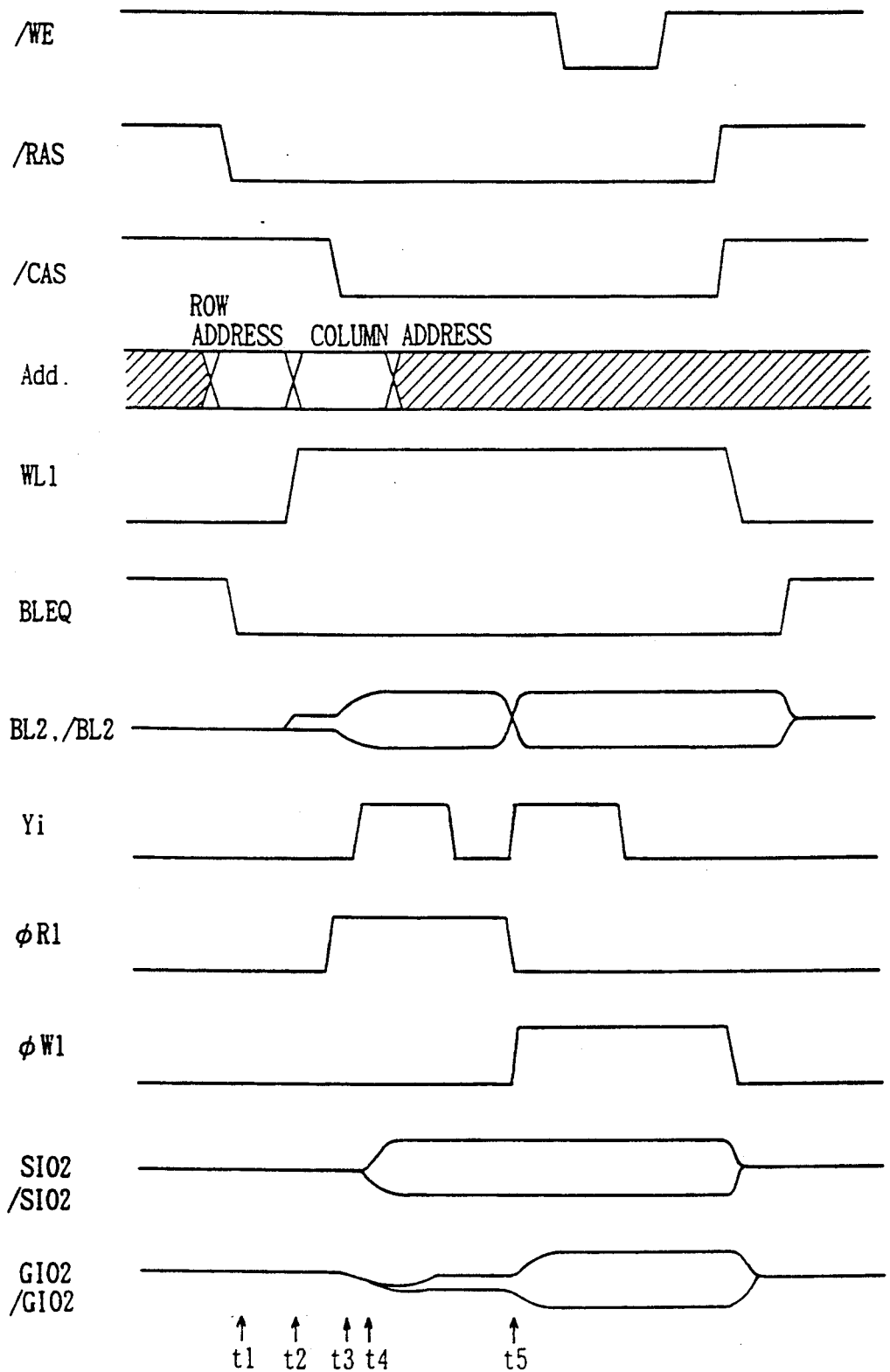
FIG. 5 is a timing chart showing another operation of the semiconductor memory device of FIG. 1, which is a third embodiment of the present invention.

Although the operation of the semiconductor memory device of FIG. 1 was described according to the timing chart of FIG. 2, the semiconductor memory device of FIG. 1 may be operated according to the timing chart of FIG. 5. FIG. 5 is a timing chart showing a third embodiment of the present invention. The timing chart of FIG. 5 differs from the timing chart of FIG. 2 in that the read gate 6R is activated at time t4 right after time t3. The operation of the semiconductor memory device of FIG. 1 will be described according to the timing chart of FIG. 5.

The operation at time t1 and t2 is similar to that of FIG. 2. At time t3, the sense amplifier is activated, and the potential difference of bit lines BL2 and /BL2 is amplified. At the time of or right after the activation of the sense amplifier (time t4), the column selecting signal Yi is pulled up to a H level.

The timing chart of FIG. 5 differs from the timing chart of FIG. 2 in that the column selecting signal Yi is pulled up simultaneously or right after the sense amplification. Therefore, the sense amplifier operation is more reliable because of a greater potential difference of the bit line pair (BL2 and /BL2) which is to be amplified by the sense amplifier. Because it is not necessary to wait until a sufficient potential difference is established in the bit line to bring the column selecting signal Yi to a H level, the read out speed of data is increased. The operation succeeding time t4 is similar to that of FIG. 2.

The semiconductor memory devices of FIGS. 1 and 3 have a possibility of preventing high speed operation in page mode operation because the potential difference of the sub-I/O line pair is increased. Therefore, an approach is considered to limit the potential difference of the sub-I/O line pair for the purpose of obtaining high speed operation even in page mode.

Figure 6:
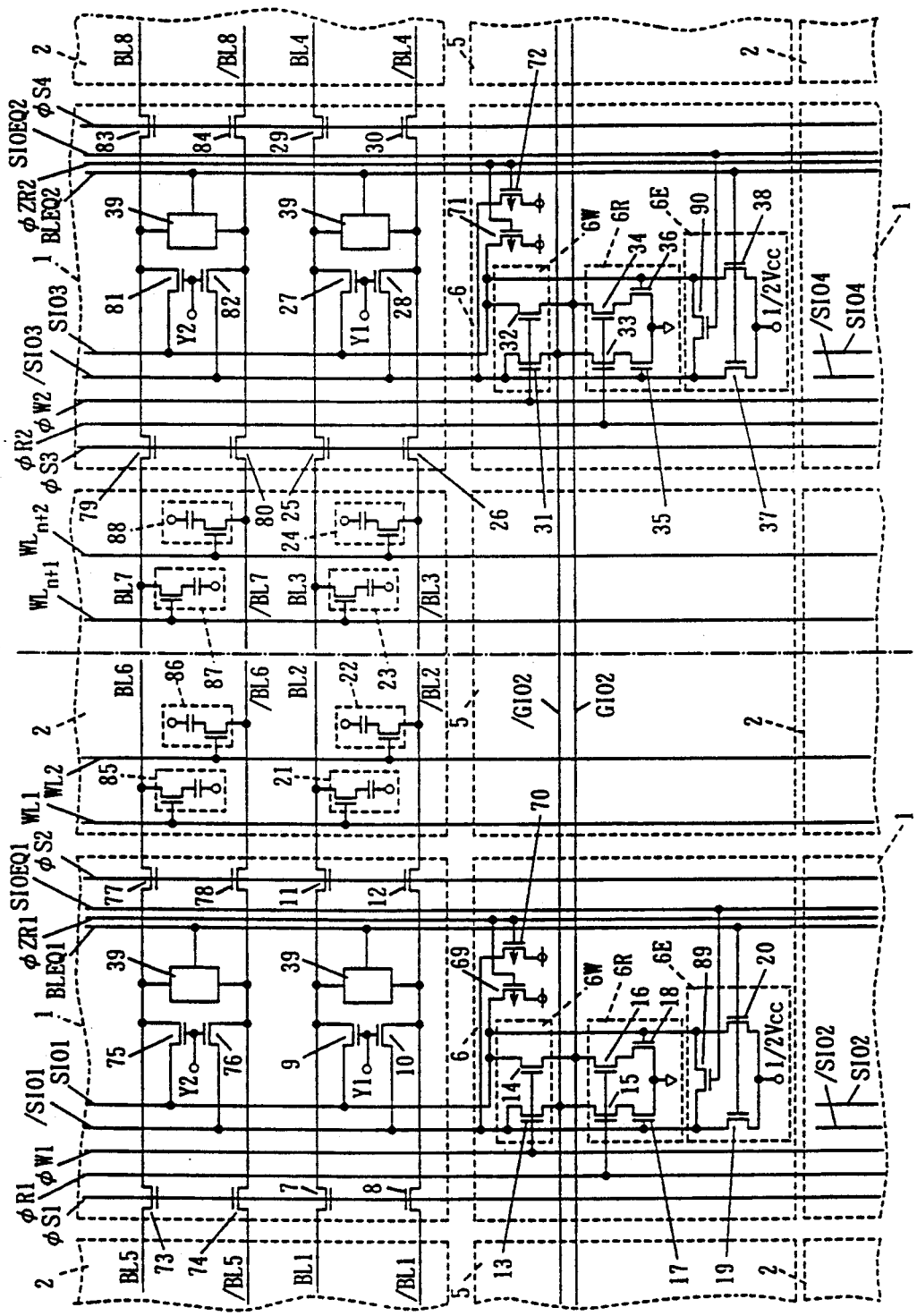
FIG. 6 is a structure of a semiconductor memory device according to a fourth embodiment of the present invention.

FIG. 6 is a circuit diagram showing a fourth embodiment of the present invention. The semiconductor memory device of FIG. 6 differs from the semiconductor memory device of FIG. 1 in that load transistors 69-72 for limiting the amplitudes of the sub-I/O lines SIO and /SIO, transistors 89 and 90 for equalization, and control signals $\phi$ZRi and SIOEQi are included. For the purpose of describing the operation of page mode, bit lines BL5-BL8 and /BL5-/BL8 of one column, corresponding NMOSFETs 73-84, memory cells 85-88, and a column selecting signal Y2 are added.

Figure 7:
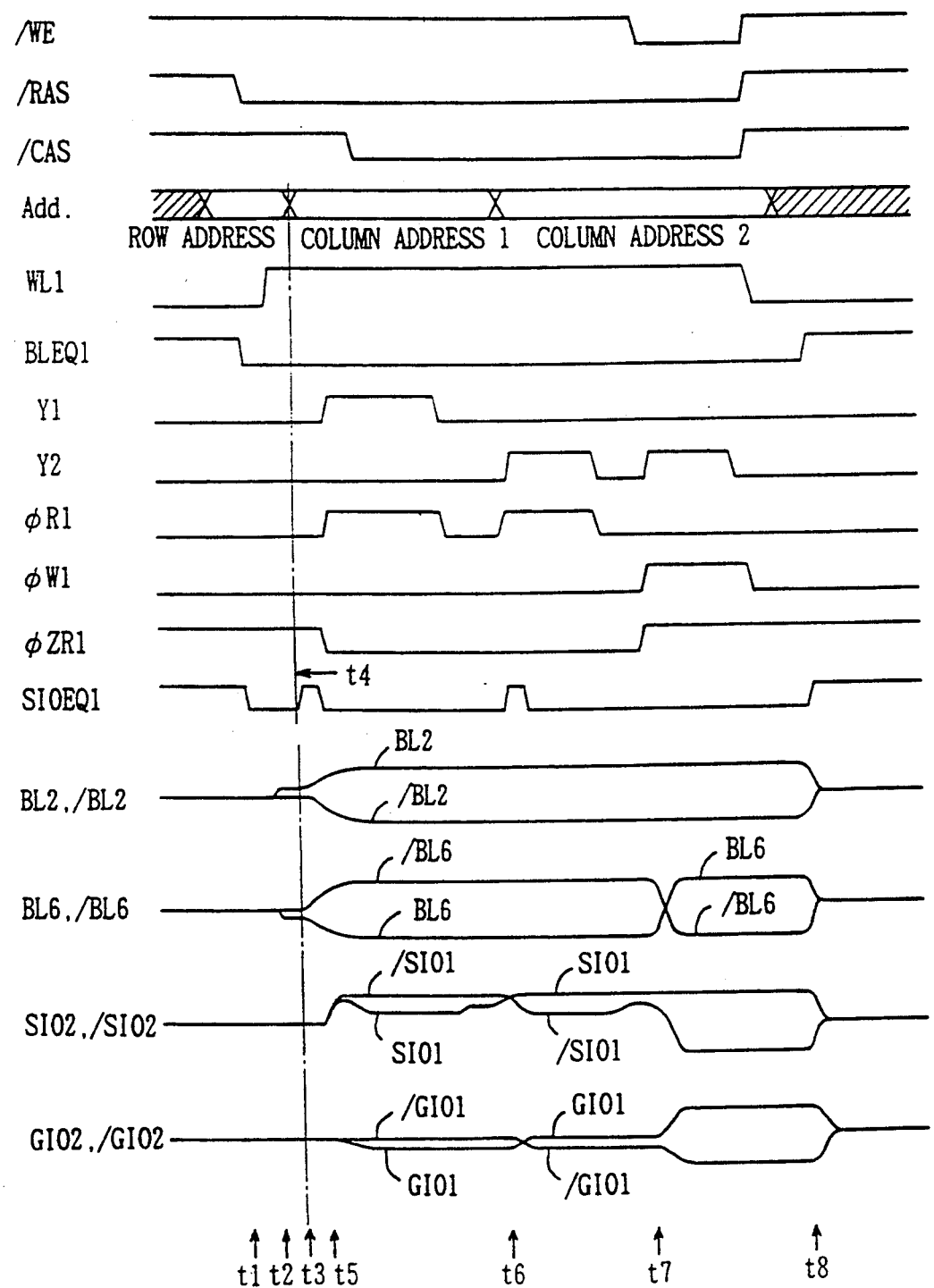
FIG. 7 is a timing chart showing an operation of the semiconductor memory device of FIG. 6.

FIG. 7 is a timing chart showing the operation of the semiconductor memory device of FIG. 6.

The operation of reading out data from memory cells 21 and 85 and then writing a data of a H level into the memory cell 85 is described with reference to the timing chart of FIG. 7, in the case where the memory cell 21 stores a data of a H level and the memory cell 85 stores a data of a L level.

Before time t1, the row address strobe signal /RAS attains a H level, and the semiconductor memory device is in a standby state. The bit line pair of BLi and /BLi and the sub-I/O line pair of SIOi and /SIOi are precharged to $\frac{1}{2}$ Vcc because the equalize signal BLEQi and SIOEQi are both at a H level.

At time t2, the word line WL1 is pulled up according to a row address signal, whereby the data in memory cells 21 and 85 are read out to bit lines BL2 and BL6, respectively. At time t3, the sense amplifier is activated. At a substantially same time of t4, the equalize signal SIOEQ1 is pulled up to a H level according to the column address signal 1 (refer to Add of FIG. 7). In response, the NMOSFET 89 is turned on and the sub-I/O line pair of SIO1 and /SIO1 is equalized. At time t5 right after time t4, the column selecting signal Y1 attains a H level, the signal φR1 for selecting a memory cell region attains a H level, and the signal φZR1 attains a L level. In response to a column selecting signal Y1 of a H level, the input/output gates 9 and 10 are turned on, whereby the potentials of the bit line pair of BL2 and /BL2 are transmitted to the sub-I/O line pair of SIO1 and /SIO1. At this time, PMOSFETs 69 and 70 are turned on, whereby the sub-I/O line pair of SIO1 and /SIO1 are pulled up to the power supply voltage of Vcc. Therefore, the amplitudes of the sub-I/O line pair of SIO1 and /SIO1 are limited as shown in FIG. 7. Although the amplitudes of the sub-I/O line pair are limited as described above, there is a potential difference sufficient for the operation of the read gate 6R, so that a read out signal is transmitted to the main I/O line pair of GIO1 and /GIO1.

Then, the address changes from the column address signal 1 to the column address signal 2, and the equalize signal SIOEQ1 attains a H level. Immediately thereafter, the column selecting signal Y2 attains a H level. In response to this column selecting signal Y2, the sub-I/O line pair of SIO2 and /SIO2 are connected to bit lines BL6 and /BL6.

Although it is necessary to invert the potentials of the sub-I/O lines in this case, the amplitudes of the sub-I/O lines are limited and equalized by the equalize signal SIOEQ1 through the function of pull-up transistors 69 and 70. Therefore, the potentials of the sub-I/O lines can be inverted at a high speed. The inverted potentials of the sub-I/O lines are detected by the read gate 6R, whereby the potentials of the main I/O lines are inverted.

At time t7 when the write signal /WE is pulled down to a L level, signals φR1, φZR1, and φW1 attain a L level, a H level, and a H level, respectively. In response, NMOSFETs 13 and 14 (write gate 6W) are turned on, and the data transmitted to the main I/O lines GIO2 and /GIO2 are transmitted to the sub-I/O lines SIO2 and /SIO2. However, because pull-up transistors 69 and 70 are turned off by the signal ZR1, the signals transmitted to the sub-I/O lines attain a full swing. The signals pulled up to the full swing level are transmitted to bit line pair of BL6 and /BL6 via input/output gates 75 and 76. The signal transmitted to bit line pairs BL6 and /BL6 is written into the memory cell 85. Thus, the data of a L level stored in the memory cell 85 can be rewritten to a data of a H level.

Although the semiconductor memory device of FIG. 6 has the sense amplifier activated prior to the column selecting signal attaining a H level, the column selecting signal may be raised prior to the activation of the sense amplifier as in the case of the semiconductor memory device of FIG. 1.

Although the semiconductor memory device of FIG. 1 does not include the NMOSFETs 89 and 90 of FIG. 6, these NMOSFETs 89 and 90 may be added to the semiconductor memory device of FIG. 1, whereby control is carried out by an equalize signal BLEQ.

Although the semiconductor memory device of FIG. 6 has pull-up transistors 69-72 and equalizing transistors 89 and 90 provided for the purpose of high speed operation in page mode, the operation in the page mode can be carried out in a sufficiently high speed even if only either of the pull up transistors or the equalize transistors are provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cell regions provided in row and column directions,
   a main data input/output line pair for transmitting externally generated data and internally generated data,
   a sub-data input/output line pair provided in a region between a pair of memory cell regions in said column direction for transmitting data to an adjacent memory cell region in said column direction,
   a plurality of data input/output control means provided in the region between the pair of memory cell regions in said column direction for carrying out data input/output control between each bit line pair of an adjacent memory cell in said column direction and said sub-data input/output line pair,
   a plurality of impedance reducing means provided between memory cell regions of said row direction for reducing the impedance of a word line,
   a plurality of read out means provided in a region surrounded by the region in which said data input/output control means are provided and by a region in which said impedance reducing means are provided for detecting and providing to said main data input/output line pair the potential difference of said sub-data input/output line pair, and
   writing means provided in a region surrounded by the region in which said data input/output control means are provided and by a region in which said impedance reducing means are provided for transferring to said sub-data input/output line pair the data of said main data input/output line pair.

2. The semiconductor memory device according to claim 1, wherein
   said word line comprises a polysilicon layer formed on a semiconductor substrate and a metal line formed on said polysilicon layer,
   said region in which said impedance reducing means is provided comprises a contact hole connecting said metal line and said polysilicon layer by every predetermined distance.

3. The semiconductor memory device according to claim 1, wherein said means for reducing the impedance of said word line comprises buffer means.

4. The semiconductor memory device according to claim 1, wherein said data input/output control means comprises
   a sense amplifier for detecting the potential difference in each bit line pair of an adjacent memory cell region, and
   an input/output gate connected between each bit line pair of said adjacent memory cell region and said sub-data input/output line pair.

5. The semiconductor memory device according to claim 4, wherein said sense amplifier has an area substantially equal to that of said read out means.

6. The semiconductor memory device according to claim 1, wherein said region surrounded by the region in which said data input/output control means are provided and by the region in which said impedance reducing means are provided comprises equalize means for equalizing said sub- o data input/output line pair.

7. The semiconductor memory device according to claim 1, wherein said region surrounded by a region in which said data input/output control means are provided and by a region in which said impedance reducing means are provided further comprises means for limiting the potential difference of signals appearing in a sub-data input/output line pair to a constant potential.

8. A semiconductor memory device comprising:
a plurality of memory cell regions arranged in row and column directions, each including a plurality of word lines provided in the row direction, a plurality of bit lines provided in the column direction, and a plurality of memory cells provided at the crossings of each word line and each bit line,
a main data input/output line pair for transmitting externally generated data and internally generated data,
a plurality of sub-data input/output line pairs provided between each pair of memory cell regions of said column direction, each transmitting data with respect to an adjacent memory cell region in said column direction,
a plurality of sense amplifiers for detecting the potential of each bit line pair in said memory cell region of said column direction,
a plurality of input/output gates provided between each pair of memory cell region of said column direction, each being connected between each bit line pair of the adjacent memory cell region in said column direction and said sub-data input/output line pair,
a plurality of impedance reducing means provided between memory cell regions of said row direction for reducing the impedance of said word line,
a plurality of read out means provided in a region surrounded by a region in which said input/output gates and said sense amplifiers are provided and by a region in which said impedance reducing means are provided, and
write means provided in a region surrounded by a region in which said input/output gates and said sense amplifiers are provided and by the region in which said impedance reducing means are provided for transferring data on said main data input/output line pair to said sub-data input/output line pair.

9. The semiconductor memory device according to claim 8, wherein said read out means is activated right after the activation of said amplifier.

10. A semiconductor memory device comprising:
a plurality of memory cell regions arranged in row and column directions, each including a plurality of word lines provided in the row direction, a plurality of bit lines provided in the column direction, and a plurality of memory cells provided at crossings of each word line and each bit line,
a main data input/output line pair for transferring externally generated data and internally generated data,
a plurality of sub-data input/output line pairs provided between each pair of memory cell regions of said column direction, each transmitting data with respect to an adjacent memory cell region in said column direction,
a plurality of sense amplifiers for detecting the potentials of each bit line pair of memory cell regions of said column direction,
a plurality of input/output gates provided between each pair of memory cell regions of said column direction, each being connected between each bit line pair of an adjacent memory cell region and said sub-data input/output line pair,
a plurality of impedance reducing means provided between memory cell regions of said row direction for reducing the impedance of said word line,
a plurality of read out means provided in a region surrounded by a region in which said input/output gates and said sense amplifiers are provided and by a region in which said impedance reducing means are provided for detecting and providing to said main data input/output line pair the potential difference of said sub-data input/output line pair,
write means provided in a region surrounded by the region in which said input/output gates and said sense amplifiers are provided and by the region in which said impedance reducing means are provided for transferring data of said main data input/output line pair to said sub-data input/output line pair, and
means for controlling the potential difference of said sub-data input/output line pair to a constant potential.

* * * * *